(12) United States Patent
Kadokura et al.

(10) Patent No.: US 6,872,419 B2
(45) Date of Patent: Mar. 29, 2005

(54) METHOD OR PROCESS FOR PRODUCING PZT FILMS AT LOW SUBSTRATE TEMPERATURES BY CHEMICAL VAPOR DEPOSITION

(75) Inventors: Hidekimi Kadokura, Tokyo (JP); Yumie Okuhara, Uoshimi-machi (JP)

(73) Assignee: Kabushikikaisha Kojundokagaku Kenkyusho, Saitama (JP)

( * ) Notice: Subject to any disclaimer, the term of this patent is extended or adjusted under 35 U.S.C. 154(b) by 130 days.

(21) Appl. No.: 10/318,719

(22) Filed: Dec. 13, 2002

(65) Prior Publication Data

US 2003/0153100 A1 Aug. 14, 2003

(30) Foreign Application Priority Data

Jan. 21, 2002 (JP) ........................................ 2002-048706

(51) Int. Cl.$^7$ .............................. B05D 5/12; C23C 16/40
(52) U.S. Cl. .............................. 427/126.3; 427/255.35; 427/255.36
(58) Field of Search ......................... 427/126.3, 255.35, 427/255.36

(56) References Cited

U.S. PATENT DOCUMENTS

| | | | | |
|---|---|---|---|---|
| 5,104,690 A | * | 4/1992 | Greenwald | 427/126.3 |
| 5,431,958 A | * | 7/1995 | Desu et al. | 427/255.32 |
| 5,641,540 A | * | 6/1997 | Lee et al. | 427/255.32 |
| 6,033,732 A | * | 3/2000 | Yuuki et al. | 427/255.29 |
| 6,376,692 B1 | * | 4/2002 | Kadokura et al. | 556/40 |

FOREIGN PATENT DOCUMENTS

JP 02002212130 A * 7/2002

* cited by examiner

*Primary Examiner*—Bret Chen
(74) *Attorney, Agent, or Firm*—Fattibene & Fattibene; Paul A. Fattibene; Arthur T. Fattibene

(57) ABSTRACT

A method or process for producing PZT films by using a Ti material having a broad allowable temperature range for providing a predetermined film composition, easily thermally deposited from Ti(OiPr)$_2$(dibm)$_2$ at a low substrate temperature of 450° C. or less in CVD. Starting materials are fed in a solution vaporization system. The starting materials, Ti(OiPr)$_2$(dibm)$_2$, used as a T1 source, and a combination of Pb(dpm)$_2$-Zr(Oipr)(dpm)$_3$-Ti(OiPr)$_2$(dibm)$_2$ in n-butyl acetate are vaporized and supplied at 200° C. The vaporized starting materials are fed into a chamber and subjected to CVD at a substrate temperature of 420° C. at 1 Torr in an oxygen atmosphere, whereby excellent PZT films can be produced. Ti(OiPr)$_2$(dibm)$_2$ has a melting point of 105° C., a high solubility and a vapor pressure of 1 Torr/150° C. and does not react with Pb(dpm)$_2$, and a solution thereof in n-butyl acetate has a pot life of 3 months.

11 Claims, 2 Drawing Sheets

METHOD OR PROCESS FOR PRODUCING PZT FILMS AT LOW SUBSTRATE TEMPERATURES BY CHEMICAL VAPOR DEPOSITION

BACKGROUND OF THE INVENTION

1. Field of the Invention

This invention relates to a process for producing PZT films by a chemical vapor deposition method.

2. Description of the Related Art

A chemical vapor deposition method (referred to hereinafter as CVD method) is used as a method of efficiently mass-producing PZT films used in highly integrated non-volatile memories. As the method of feeding their starting materials, there is a system of feeding vapors of Pb, Ti and Zr compounds themselves or a system of feeding the vapors from solutions.

In place of highly volatile, highly toxic tetraethyl lead, lead bis(β-diketonate) particularly lead bis(dipivaloylmethanate) (referred to hereinafter as $Pb(dpm)_2$) has been examined as the Pb source. However, the vapor pressure of this compound is as low as 0.2 Torr at 150° C. Accordingly, the system of feeding a vapor thereof from a solution prepared by dissolving the compound in an organic solvent is advantageous to mass-production of PZT films over the system of feeding a vapor of the compound itself because a larger amount of Pb source can be fed.

THF, octane or butyl acetate is used as the solvent. In vaporization of the solution, it is desired that the respective solutions of Pb, Zr and Ti materials are mixed just before a vaporizer and fed after vaporization in the same vaporizer, or one solution containing Pb, Zr and Ti is used as the starting material and fed after vaporization in the same vaporizer. In the latter system in particular, the facilities used would be simplified and the compositions of the resultant films could be varied less than in the former. In either system, the starting materials are in the form of a mixed solution in the vaporizer at about 200° C. and for about 1 to 10 seconds just before the vaporizer. At this stage, $Ti(OiPr)_4$ and $Zr(OtBu)_4$ whose vaporization characteristics are changed upon reaction with $Pb(dpm)_2$ are not preferable. P. C. van Buskirk et al. disclose, in Integrated Ferroelectrics, Vol. 21, 273 (1998), that a combination of $Pb(dpm)_2$-$Zr(dpm)_4$-$Ti(OiPr)_2(dpm)_2$ is preferable.

Further, the temperature at which $ZrO_2$ is deposited from $Zr(dpm)_4$ is considerably higher than the temperature at which PbO is deposited from $Pb(dpm)_2$, so that as Zr compounds showing a lower deposition temperature, $Zr(OiPr)_2(dpm)_2$ and $Zr_2(OiPr)_6(dpm)_2$ are disclosed in WO 98/51837, and $Zr(OiPr)(dpm)_3$ is disclosed in Japanese Patent Application Laid-Open No. 2001-151782. As a Ti source used in combination therewith, however, $Ti(OiPr)_2(dpm)_2$ only has been disclosed.

If nonvolatile memories of PZT were produced at temperatures lower than the temperature at which Al circuits are durable, semiconductor devices highly integrated with multi-layered metals could be produced, and thus production of PZT films at a substrate temperature of 500° C. or less, preferably 450° C. or less has been examined (JP-A No. 2000-58526 etc.). Given a combination of $Pb(dpm)_2$-$Zr(OtBu)_4$-$Ti(OiPr)_4$-$NO_2$, PZT films can be produced at this low temperature, but there is no related art teaching that the starting materials are fed in the solution vaporization system and PZT films are produced at temperatures lower than a substrate temperature of 450° C. or less.

SUMMARY OF THE INVENTION

The present inventors have found that when a combination of $Pb(dpm)_2$-$Zr(OiPr)(dpm)_3$-$Ti(OiPr)_2(dpm)_2$ is as the starting material in solution vaporization to produce PZT films, the allowable temperature range in which a predetermined film composition is obtained at a substrate temperature of 500 to 600° C. is broad, but use of this combination at 450° C. or less is problematic because films hardly incorporate $TiO_2$, thus requiring $Ti(OiPr)_2(dpm)_2$ fed in large excess while the film-forming allowable temperature range for a predetermined film composition is narrow. This is possibly because the temperature at which $TiO_2$ is deposited from $Ti(OiPr)_2(dpm)_2$ is higher than the temperatures at which Pb and Zr are deposited from $Pb(dpm)_2$ and $Zr(OiPr)(dpm)_3$ respectively.

To solve this problem, the object of this invention is to provide a process for producing PZT films in the practically broad allowable temperature range of 450° C. or less by finding a Ti-source compound depositing $TiO_2$ at a slightly lower temperature than by $Ti(OiPr)_2(dpm)_2$.

The present inventors have found that when titanium di(isopropoxy)bis(diisobutyrylmethanate) is used as a Ti compound, PZT films can be produced at low temperatures of 450° C. or less, the allowable temperature range for the film composition can be broader, the compound itself can be vaporized without degradation at a vaporization temperature of 200° C., and in a solution, does not easily react with $Pb(dpm)_2$ or $Zr(OiPr)(dpm)_3$, and this invention was thereby completed.

Titanium di(isopropoxy)bis(diisobutyrylmethanate) {=titanium di(2-propoxy)bis(2,6-dimethyl-3,5-heptanedionate)} is a known compound disclosed by W. W. Haskell and T. E. Kiovsky in Combustion & Flame Vol. 43, 303 (1981). However, there is no description of the thermal stability, vapor pressure and thermal decomposition temperature thereof used in CVD and the temperature dependence of $TiO_2$ deposition. In particular, when PZT films are formed, formation of the films at 350 to 450° C. by using this Ti compound in combination with $Pb(dpm)_2$ and $Zr(OiPr)(dpm)_3$ has never been examined.

That is, this invention relates to a process for producing PZT films by chemical vapor deposition with starting materials fed through solution vaporization, wherein titanium di(isopropoxy)bis(diisobutyrylmethanate) is used as the Ti source.

Further, this invention relates to a process for producing PZT films, wherein titanium di(isopropoxy)bis (diisobutyrylmethanate) is used as the Ti source, lead bis(dipivaloylmethanate) as the Pb source, and zirconium (isopropoxy)tris(dipivaloylmethanate) as the Zr source.

Furthermore, this invention relates to the above-described process for producing PZT films, wherein the temperature of a film-forming substrate is 350 to 450° C.

Furthermore, this invention relates to the above-described process for producing PZT films, wherein titanium di(isopropoxy)bis(diisobutyrylmethanate) obtained by reacting $Ti(OiPr)_4$ with diisobutyrylmethane under heating in an inert organic solvent and then vacuum-distilling the product.

Furthermore, this invention relates to the above-described process for producing PZT films, wherein the respective solutions of the Pb, Zr and Ti compounds are evaporated in the same evaporator and supplied.

Moreover, this invention relates to the above-described process for producing PZT films, wherein one solution containing the Pb, Zr and Ti compounds is used as the starting materials.

Finally, this invention relates to the above-described process for producing PZT films, wherein the solvent used in the solution is butyl acetate.

DETAILED DESCRIPTION OF THE INVENTION

A process for producing Ti(OiPr)$_2$(dpm)$_2$ described by R. C. Fay and A. F. Lindmark in J. Am. Chem. Soc. Vol. 105, 2118 (1983) can be applied to the process for producing titanium di(isopropoxy)bis(diisobutylmethanate) {Ti(OiC$_3$H$_7$)$_2$[H(H$_3$C)$_2$C(CO)CH(CO—)C(CH$_3$)$_2$H]$_2$, titanium di(2-propoxy)bis(2,6-dimethyl-3,5-heptanedionate), referred to hereinafter as Ti(OiPr)$_2$(dibm)$_2$}. The reaction scheme is as follows:

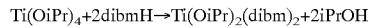

Ti(OiPr)$_4$+2dibmH→Ti(OiPr)$_2$(dibm)$_2$+2iPrOH

When Ti(OiPr)$_4$ and dibmH (diisobutyrylmethane) whose amount is 1 to 1.05 times as high as the equivalent weight in the reaction scheme are heated under reflux in an inert organic solvent such as toluene, the reaction proceeds quantitatively. Then, the byproduct iPrOH, the solvent and the unreacted dibmH are distilled away at normal pressures to 1 Torr. Purification can be effected by recrystallization, but vacuum distillation at 0.01 to 1 Torr is preferable. Ti(OiPr)$_2$(dibm)$_2$ consisting exclusively of the volatile component which is most preferable as a starting material in solution vaporization and free of particles or nonvolatile components can be obtained in this manner. At the time when the reaction is finished, the solution is pale orange, but the vacuum-distilled Ti(OiPr)$_2$(dibm)$_2$ is colored violet. It is estimated that this coloration is attributable to a very small amount of thermally decomposed and reduced Ti (III) contained therein. However, when the Ti(OiPr)$_2$(dibm)$_2$ is dissolved in a solvent such as butyl acetate, the solution will turn a completely transparent pale orange solution.

Results of measurement of main physical properties, necessary for CVD, of Ti(OiPr)$_2$(dibm)$_2$ obtained in Example 1 are shown below.

Figure 1:
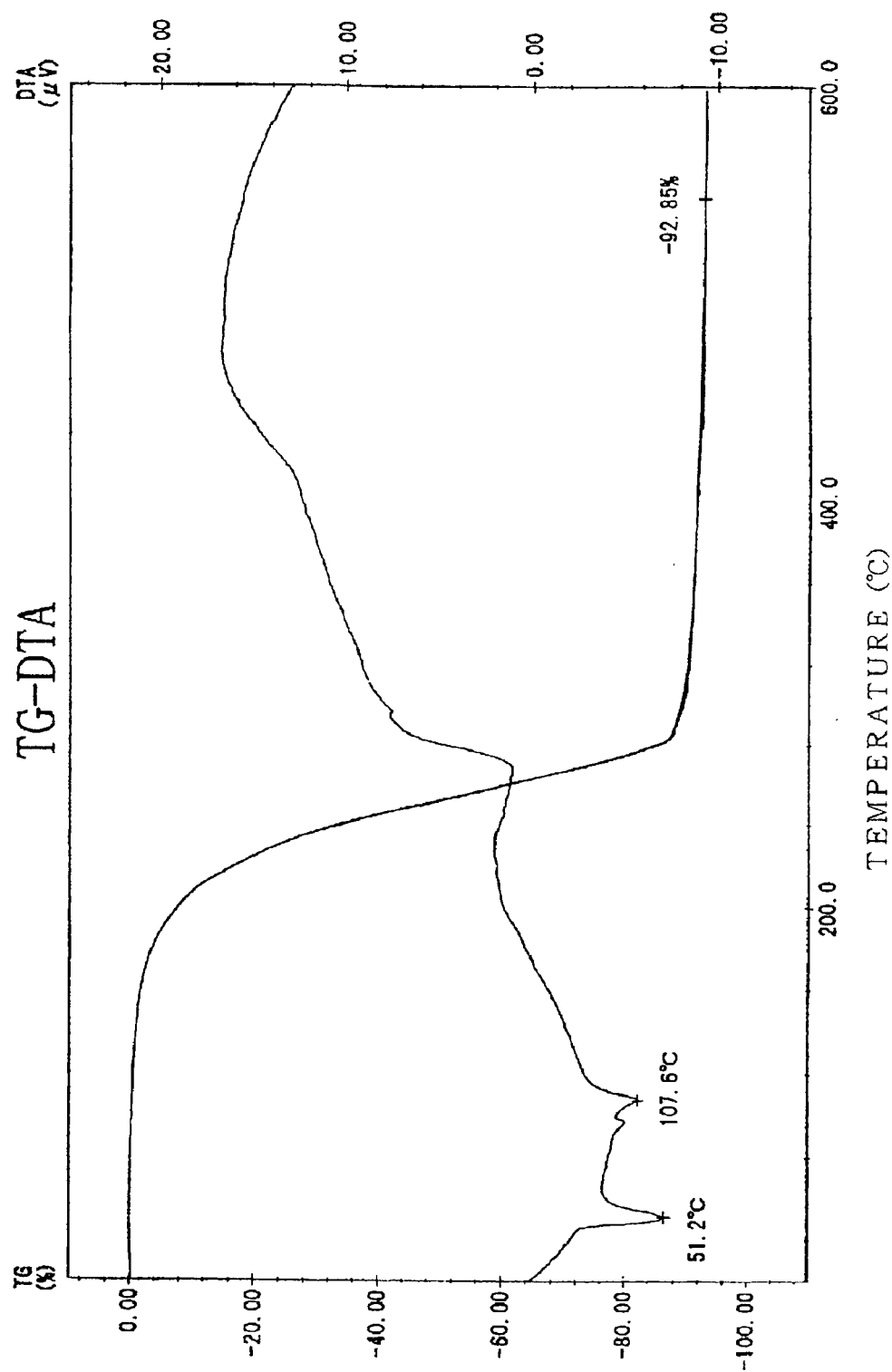
FIG. 1 is a graph showing the measurement result of Ti(OiPr)$_2$(dibm)$_2$ at 1 atm of Ar by TG-DTA.

(1) Composition Analysis
Results of ICP emission spectroscopic analysis:
Found Ti content: 9.77% (theoretical: 9.98%)
(2) Analysis of Impurities
Results of ICP emission spectroscopic analysis (unit ppm) are as follows:
Al 1, Ca 1, Cu<1, Cr 1, Fe 1, K<1, Na 1, Mg<1, Zn<1, indicating that the product had high purity. As a result of analysis of total Cl, Cl was <2 ppm.
(3) State and Melting Point
Violet solids: it is estimated that this coloration is attributable to a very small amount of Ti (III) contained therein.
Melting point: 105° C.
(4) Vapor Pressure
About 1 Torr/150° C.
(5) TG-DTA
Measurement conditions: heating rate of 10.0 deg/min.
Measurement was carried out under two kinds of conditions, that is, at 1 atmospheric pressure of Ar and 2 Torr of Ar.
Ar, 1 atmospheric pressure: a profile of 12.1 mg of the test sample is shown in FIG. 1.
Ar, 2 Torr: a profile of 13.7 mg of the test sample is shown in FIG. 2.

Figure 2:
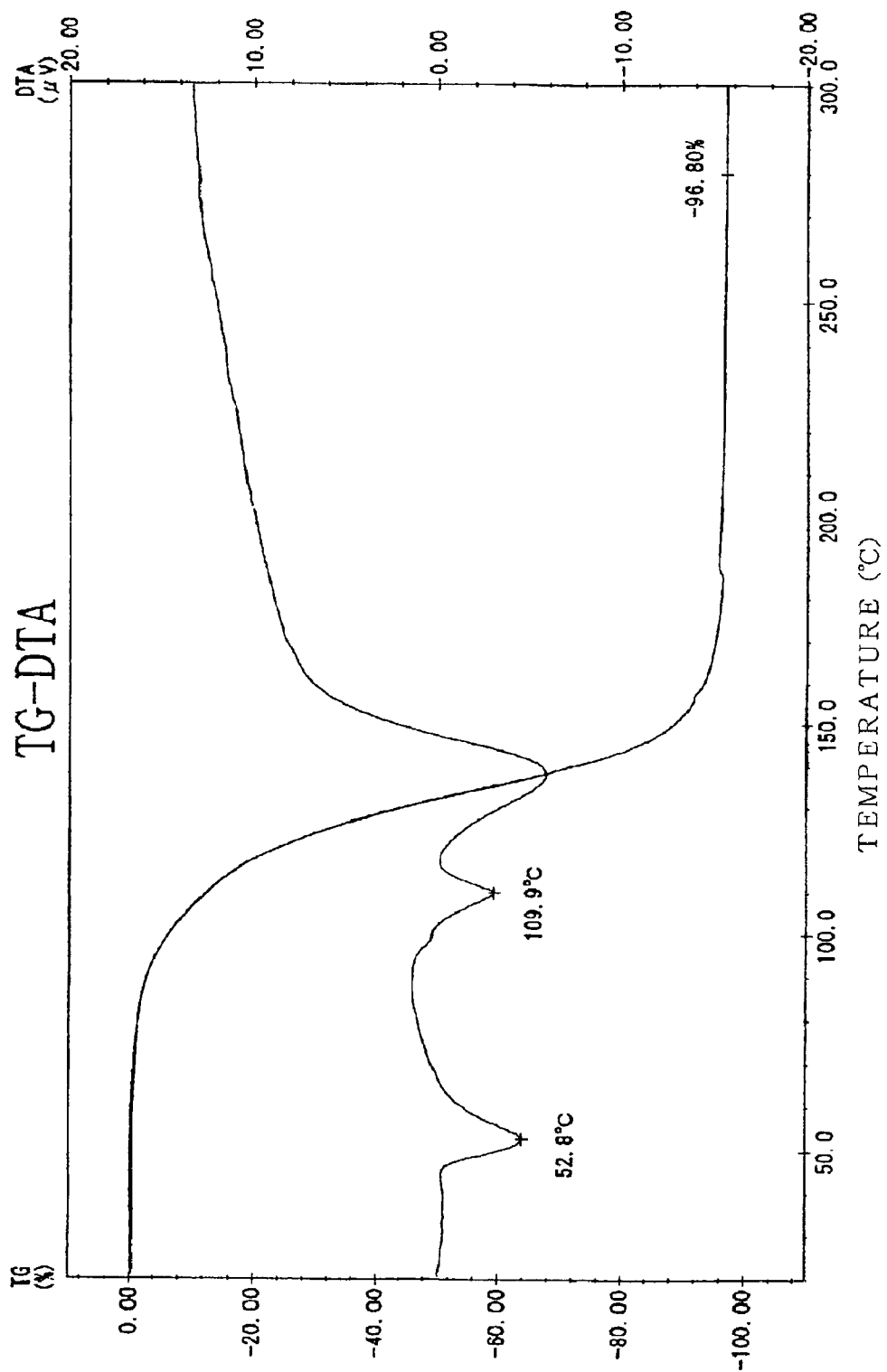
FIG. 2 is a graph showing the measurement result of Ti(OiPr)$_2$(dibm)$_2$ at 2 Torr of Ar by TG-DTA.

From FIGS. 1 and 2, it does not seem that Ti(OiPr)$_2$(dibm)$_2$ is thermally decomposed at 200° C. or less. The reduction in the weight thereof at 2 Torr at 300° C. was 96.8% but not 100%; nevertheless, the sample was considered completely vaporized because there was no residue on a vessel. It is estimated that heat absorption at about 50° C. is attributable to transition of the crystal structure, while heat absorption at about 105° C. is attributable to melting.
(6) Solubility
The weight (unit: g) of the sample dissolved in 1 L solvent at room temperature is shown in Table 1.

As can be seen from Table 1, the sample is dissolved well in n-butyl acetate or THF.

TABLE 1

| Solvent | n-butyl acetate | THF | toluene | hexane |
|---|---|---|---|---|
| Solubility | 1600 | 2300 | 1600 | 1300 |

The lower substrate temperature at which Ti(OiPr)$_2$(dibm)$_2$ was confirmed to be deposited as TiO$_2$ on a substrate in CVD, examined in Example 2, was about 360° C. This temperature was lower by about 40° C. than the temperature (about 400° C.) determined for Ti(OiPr)$_2$(dpm)$_2$ in Comparative Example 1. This is possibly because the dibm group is oxidatively decomposed at a lower temperature than the dpm group. That is, the above result indicates that Ti(OiPr)$_2$(dibm)$_2$ can be used to form PZT films at a lower temperature. This tendency of the two compounds does not change although the absolute temperature is varied depending on the pressure in CVD or the type of oxidizing gas.

Lead bis(β-diketonate) as one of the components for forming a PZT film in this invention includes Pb(dpm)$_2$, lead bis(2,2,6,6-tetramethyl-3,5-octanedionate), lead bis(2,2,6-trimethyl-3,5-heptanedionate) and lead bis(6-ethyl-2,2-dimethyl-3,5-octanedionate). Preferably, the component is most thermally stable Pb(dpm)$_2$.

The Zr compound as one of the components for forming a PZT film in this invention includes Zr(OiPr)(dpm)$_3$ or Zr(dibm)$_4$ which can be deposited at low temperatures. The Zr compound is preferably Zr(OiPr)(dpm)$_3$.

As the solvent in this invention, the solvents in Table 1 can be used, among which n-butyl acetate is preferable in respect of solubility, boiling point, safety, and vaporization characteristics of the solution. When highly pure Pb(dpm)$_2$, Zr(OiPr)(dpm)$_3$ or Ti(OiPr)$_2$(dibm)$_2$ is used, a stable solution having a long pot life in a pure n-butyl acetate solvent can be formed.

Ti(OiPr)$_2$(dibm)$_2$ hardly reacts with Pb(dpm)$_2$ or Zr(OiPr)(dpm)$_3$ or hardly undergoes ligand exchange reaction.

In this invention, the respective solutions of the Pb, Zr and Ti compounds are measured by their respective source cylinders and mixed just before a vaporizer, and they are vaporized by the same vaporizer and fed to a CVD chamber. This system enables production of the film at 2 stages consisting of nucleating treatment of Pb and Ti raw materials to form PbTiO$_3$ and subsequent production of the film. The pot life of the solution is longer than that in the one-solution method described later. Use of only one vaporizer is also advantageous to the facilities.

Another feeding system in this invention is a system wherein one solution containing the Pb, Zr and Ti compounds is used as the starting material, and the solution is vaporized by a vaporizer and then fed to a CVD chamber. The feeding unit is most simplified and most excellent in the uniformity of the composition of the solution and in the uniformity of the composition of the resultant film.

In this invention, the temperature of a substrate for PZT film is 350 to 450° C. This low substrate temperature can be applied to production of not only $PbTiO_3$ films but also PLZT films partially containing La. By using the compounds capable of depositing Pb, Zr and La sources at low temperatures, films exhibiting good ferroelectric properties even at such low temperatures can be obtained. As the oxidizing gas, $O_2$, $O_3$, $N_2O$, $NO_2$ etc. can be used. The pressure in the CVD chamber is 0.001 to 10 Torr.

EXAMPLES

Example 1

Production of $Ti(OiPr)_2(dibm)_2$

A 300 ml four-necked flask equipped with a reflux condenser, a thermometer and a stirrer in which the atmosphere had been vacuum-replaced by argon was charged with 100 ml toluene and then with 17.4 g (61 mmol) of $Ti(OiPr)_4$ and 20.2 g (129 mmol) of diisobutyrylmethane dibmH. Then, the mixture was heated under stirring and reacted for 5 hours in a heated and refluxed state, to give a pale blown solution. Then, a byproduct iPrOH, the solvent and the unreacted dibmH were distilled away under reduced pressure. After the reflux condenser was replaced by a 3-way distilling adapter, a violet liquid was distilled at 0.7 Torr at a distillation temperature of about 140° C. and then immediately solidified. The recovery was 27.4 g (57.5 mmol), and the yield was 94%. This compound was determined to be $Ti(OiPr)_2(dibm)_2$ on the basis of its origin and the Ti content previously described. Violet coloration is considered attributable to contamination of the product with a very small amount of Ti (III) compound formed during distillation at 130° C. or more. If the product is dissolved in a n-butyl acetate solvent and left for a while, its color turns pale orange. This is considered due to conversion of Ti (III) into Ti (IV) by slightly dissolved oxygen etc. It is estimated that the product purified by recrystallization without heating is not violet.

Example 2

Production of $TiO_2$ Film by CVD of $Ti(OiPr)_2(dibm)_2$

A solution of $Ti(OiPr)_2(dibm)_2$ in butyl acetate (concentration 0.1 mol/l) was fed at a rate of 0.1 ml/min. to a vaporizer at 200° C., then vaporized together with 200 sccm preheated Ar gas and fed to a CVD chamber. This vapor was mixed with 100 sccm preheated $O_2$ gas in an inlet of the CVD chamber, introduced onto a Si substrate previously heated at 350 to 450° C. at a reaction pressure of 1 Torr, and deposited on the substrate. After 20 minutes, the substrate was taken out, and when the thickness of the film thereon was measured, an about 20 nm $TiO_2$ film had been formed at 360° C. The thickness of the film was about 70 nm at 400° C. or 450° C.

Comparative Example 1

Production of $TiO_2$ Film by CVD of $Ti(OiPr)_2(dpm)_2$

The same procedure as in Example 2 was carried out except that $Ti(OiPr)_2(dpm)_2$ was used in place of $Ti(OiPr)_2(dibm)_2$ in Example 2. No film was formed at 360° C., an about 10 nm $TiO_2$ film was formed at 400° C., and an about 40 nm film was formed at 450° C.

As can be seen from the results in Example 2 and Comparative Example 1, the lower temperature for forming the $TiO_2$ film from $Ti(OiPr)_2(dibm)_2$ is lower by about 40 to 50° C. than from $Ti(OiPr)_2(dpm)_2$.

Example 3

Production of PZT Film by Using a Solution of $Ti(OiPr)_2(dibm)_2$

A solution of $Pb(dpm)_2$ in n-butyl acetate (concentration 0.1 mol/l) was fed at a rate of 0.1 ml/min., a solution of $Zr(OiPr)(dpm)_3$ in n-butyl acetate (concentration 0.1 mol/l) was fed at a rate of 0.1 ml/min., and a solution of $Ti(OiPr)_2(dibm)_2$ in n-butyl acetate (concentration 0.1 mol/l) was fed at a rate of 0.15 ml/min., and these 3 solutions were mixed just before a vaporizer, then vaporized together with 300 sccm preheated Ar gas in the vaporizer at 200° C., and fed to a CVD chamber. This vapor was mixed with 700 sccm preheated $O_2$ gas in an outlet of the CVD chamber and introduced onto a Pt (111)/$SiO_2$/Si substrate previously heated at 420° C. at a reaction pressure of 1 Torr, and deposited on the substrate. After 30 minutes, the substrate was taken out, and when the thickness of the film thereon was measured, an about 200 nm film had been formed. According to XRD, the film was made of PZT in a perovskite phase, and as a result of analysis of the composition, Pb:Zr:Ti was 1.0:0.55:0.45. The composition of the film was not varied even at a film-making temperature different by 20° C.

Comparative Examples 2 and 3

Production of PZT Film by Using a Solution of $Ti(OiPr)_2(dpm)_2$

A film was produced by the same procedure as in Example 3 except that $Ti(OiPr)_2(dpm)_2$ was used in place of $Ti(OiPr)_2(dibm)_2$ in Example 3. As a result of analysis of the composition of the film, Pb:Zr:Ti=1.0:0.85:0.15, indicating a low Ti content, and a good perovskite phase was not formed (Comparative Example 2).

Accordingly, the rate of feeding $Ti(OiPr)_2(dpm)_2$ was increased to 0.5 ml/min. which was 3.3 times as high as the previous rate, and as a result, a film of PZT in a perovskite phase with a composition of Pb:Zr:Ti=1.0:0.55:0.45 was obtained (Comparative Example 3).

However, there still remained the problem of a varying film composition at a film-forming temperature different by 10° C.

Example 4

Pot life of a Solution of $Ti(OiPr)_2(dibm)_2$ in n-butyl acetate 45 ml n-butyl acetate previously dehydrated to a water content of 15 ppm and deoxygenated under reduced pressure was introduced into a measuring flask, and 7.2 g (15 mmol) of $Ti(OiPr)_2(dibm)_2$ was dissolved therein and sealed together with dry Ar as the gaseous phase in the flask. The solution just after prepared was violet, but when left for a while, the solution became a pale yellow and completely transparent solution. This solution was kept at room temperature, and when its color and turbidity were observed after 3 months, the solution had maintained the original pale yellow and completely transparent state. This solution left for 3 months was introduced into a flask, and the solvent was removed by vaporization at room temperature under vacuum, and then the residue was vacuum-distilled at 140° C., and as a result, the total amount of the compound was recovered by vaporization, leaving a very thin and pale violet film only on the inner wall of the flask. The solution of the compound was found to be normal without changing its vaporization characteristics. Accordingly, the pot life of the solution can be said to be 3 months.

Example 5
Pot Life of a PZT-forming Solution in n-butyl acetate 90 ml n-butyl acetate previously dehydrated to a water content of 15 ppm and deoxygenated under reduced pressure was placed in a measuring flask, and 5.7 g (10 mmol) of Pb(dpm)$_2$, 7.0 g (10 mmol) of Zr(OiPr)(dpm)$_3$, and 4.8 g (10 mmol) of Ti(OiPr)$_2$(dibm)$_2$ were dissolved therein and sealed together with dry Ar as the gaseous phase in the flask. The solution just after prepared was violet, but when left for a while, the solution became a pale yellow and completely transparent solution. This solution was kept at room temperature, and when its color and turbidity were observed after 3 months, the solution had maintained its original pale yellow and completely transparent state. This solution left for 3 months was introduced into a flask, and the solvent was removed by vaporization at room temperature under vacuum, and then the residue was vacuum-distilled at 0.03 Torr in a heating bath at a temperature of 150 to 190° C., whereby 16.5 g product was recovered by vaporization, leaving 0.5 g black violet film in the flask. As is evident from 16.5/(5.7+7.0+4.8)=0.94, almost all the product was recovered by vaporization, and in consideration of thermal degradation during vacuum distillation at high temperature for 1 hour, the solution thereof at room temperature was estimated to be normal without changing its vaporization characteristics. Accordingly, the pot life of the solution can be said to be 3 months.

PZT films can be produced with a smaller amount of supplied than Ti(OiPr)$_2$(dpm)$_2$ in the practically broad allowable temperature range of 450° C. or less by using a solution of Ti(OiPr)$_2$(dibm)$_2$ as a Ti source in CVD where starting materials are fed in a solution vaporization system.

What is claimed is:

1. A process for producing PZT films by chemical vapor deposition method with starting materials fed through solution vaporization, wherein titanium di(isopropoxy)bis(diisobutyrylmethanate) is used as the Ti source.

2. The process for producing PZT films by chemical vapor deposition method according to claim 1, wherein lead bis(dipivaloylmethanate) is used as the Pb source, and zirconium (isopropoxy)tris(dipivaloylmethanate) as the Zr source.

3. The process for producing PZT films by chemical vapor deposition method according to claim 2, wherein the respective solutions of the Pb, Zr and Ti compounds are evaporated in the same evaporator and supplied.

4. The process for producing PZT films by chemical vapor deposition method according to claim 2, wherein one solution containing the Pb, Zr and Ti compounds is used as the starting materials.

5. The process for producing PZT films by chemical vapor deposition method according to claim 1, wherein the temperature of a film-forming substrate is 350 to 450° C.

6. The process for producing PZT films by chemical vapor deposition method according to claim 1, wherein titanium the di(isopropoxy)bis(diisobutyrylmethanate) is obtained by reacting Ti(OiPr)$_4$ with diisobutyrylmethane under heating in an inert organic solvent and then vacuum-distilling the product.

7. The process for producing PZT films by chemical vapor deposition method according to claim 1, wherein the solvent used in the solution is butyl acetate.

8. A method of producing a PZT film on a substrate by chemical vapor deposition comprising the steps of:

mixing a solution of a compound of lead, a compound of zirconium, and titanium di(isopropoxy)bis(diisobutyrylmethanate) in a solvent;

heating the substrate to less than 450 degrees centigrade;

vaporizing the solution;

feeding the vaporized solution into a chamber containing the heated substrate, whereby the PZT film is formed on the substrate.

9. A method of producing a PZT film on a substrate as in claim 8 wherein:

the titanium di(isopropoxy)bis(diisobutyrylmethanate) is obtained by reacting Ti(OiPr)$_4$ with diisobutyrylmethane under heating in an inert organic solvent and then vacuum-distilling the product.

10. A method of producing a PZT film on a substrate by chemical vapor deposition comprising the steps of:

mixing a solution of lead bis(dipivaloylmethanate), zirconium(isopropoxy)tris(dipivaloylmethanate), and titanium di(isopropoxy)bis(diisobutyrylmethanate) in a solvent;

heating the substrate to less than 450 degrees centigrade;

vaporizing the solution;

feeding the vaporized solution into a chamber containing the heated substrate, whereby the PZT film is formed on the substrate.

11. A method of producing a PZT film on a substrate as in claim 10 wherein:

the solvent comprises butyl acetate.

* * * * *